(12) United States Patent
Phillips

(10) Patent No.: US 6,476,542 B2
(45) Date of Patent: Nov. 5, 2002

(54) PIEZOELECTRIC TRANSFORMER WITH DUAL-PHASE INPUT DRIVE

(75) Inventor: James R. Phillips, Albuquerque, NM (US)

(73) Assignee: CTS Corporation, Elkhart, IN (US)

( * ) Notice: Subject to any disclaimer, the term of this patent is extended or adjusted under 35 U.S.C. 154(b) by 0 days.

(21) Appl. No.: 09/742,824

(22) Filed: Dec. 20, 2000

(65) Prior Publication Data

US 2002/0074903 A1 Jun. 20, 2002

(51) Int. Cl.⁷ .............................................. H01L 41/08
(52) U.S. Cl. ........................ 310/359; 310/317; 310/358
(58) Field of Search ................................. 310/358, 359, 310/366, 317, 316.01, 319

(56) References Cited

U.S. PATENT DOCUMENTS

| 5,278,471 A | | 1/1994 | Uehara et al. |
| 5,440,195 A | | 8/1995 | Ohnishi |
| 5,463,266 A | * | 10/1995 | Fukuoka et al. ............ 310/359 |
| 5,736,807 A | | 4/1998 | Hakamata et al. |
| 5,747,914 A | | 5/1998 | Huang et al. |
| 5,751,092 A | * | 5/1998 | Abe .......................... 310/359 |
| 5,872,419 A | | 2/1999 | Hall et al. |
| 5,877,581 A | * | 3/1999 | Inoi et al. ................... 310/358 |
| 5,969,954 A | | 10/1999 | Zaitsu |
| 6,016,052 A | | 1/2000 | Vaughn |
| 6,037,706 A | * | 3/2000 | Inoi et al. ................... 310/359 |
| 6,051,915 A | | 4/2000 | Katsuno et al. |
| 6,065,196 A | * | 5/2000 | Inoi et al. ............... 310/366 X |
| 6,111,933 A | | 8/2000 | Schaaf et al. |
| 6,172,447 B1 | | 1/2001 | Ishikawa et al. |
| 6,288,479 B1 | * | 9/2001 | Watanabe ................... 310/359 |

* cited by examiner

Primary Examiner—Mark O. Budd
(74) Attorney, Agent, or Firm—Nelson Nolte; Steven Weseman

(57) ABSTRACT

The present invention provides at least two input driving sections for a piezoelectric transformer. The two input driving sections are configured in a stacked configuration, with either one section on top of the other or the sections interlaced. Each input driving section includes a pair of electrodes. All of the electrodes preferably have a distinct electrode shape. The two input driving sections provide for the application of phase-modulated input signals to control the gain or amplitude of the transformer output.

9 Claims, 3 Drawing Sheets

PIEZOELECTRIC TRANSFORMER WITH DUAL-PHASE INPUT DRIVE

FIELD OF THE INVENTION

The present invention relates to piezoelectric devices and more particularly to a piezoelectric transformer that utilizes two input drive sections.

BACKGROUND OF THE INVENTION

PZT transformers are basically energy converters. A PZT transformer converts an electrical input into mechanical energy and subsequently reconverts this mechanical energy back to an electrical output. The mechanical transport causes the PZT transformer to vibrate, similar to quartz-crystal operation, but at acoustic frequencies. The resonance associated with this acoustic activity is extraordinarily high; Q factors greater than 1000 are typical. This transformer action results from using properties of certain ceramic materials and structures. The physical configuration and number of layers in its construction set a PZT transformer's voltage gain.

Many materials, such as quartz, lithium niobate, and lead-zirconate-lead-titanate (PZT) exhibit some form of the piezoelectric effect. The piezoelectric transformer uses PZT, hence, it is a PZT transformer. Two piezoelectric effects exist: the direct effect and the inverse effect. With the direct effect, placing a force or vibration (stress) on the piezoelectric element generates a charge. The polarity of this charge depends on the orientation of the stress compared with the direction of polarization in the piezoelectric element. During the manufacturing process, poling, or applying a high dc field in the range of 45 kV/cm to the PZT transformer, sets the polarization direction.

The inverse piezoelectric effect is, as the name implies, the opposite of the direct effect. Applying an electric field, or voltage, to the piezoelectric element results in a dimensional change, or strain. The direction of the change is likewise linked to the polarization direction. Applying a field at the same polarity of the element results in a dimensional increase, and fields of opposite polarity result in a decrease. An increase in one dimension in a structure results in a decrease in the other two through Poisson's coupling, or the fact that lateral strain results in longitudinal strain at Poisson's ratio. This phenomenon is an important factor in the operation of the transformer.

The piezoelectric transformer uses both the direct and inverse effects to create high-voltage step-up ratios. A sine-wave voltage drives the input portion of the transformer, which causes it to vibrate. This operation is the inverse, or motor, effect. The vibration couples through the structure to the output to generate an output voltage, which is the direct, or generator, effect.

The piezoelectric transformer is constructed of PZT ceramic, but more precisely it is a multilayer ceramic. The manufacturing of the transformer is similar to the manufacturing of ceramic chip capacitors. The process prints layers of flexible, unfired PZT-ceramic tape with metallic patterns, then aligns and stacks the layers to form the required structure. The next step involves pressing, dicing, and firing the stacks to create the final ceramic device.

The input section of the transformer has a multilayer ceramic-capacitor structure. The pattern of the metal electrodes creates an interdigitated plate configuration. The output section of the transformer has no electrode plates between the ceramic layers, so firing produces a single ceramic output structure. Conductive material, which forms the output electrode for the transformer, coats the end of the output section.

The next construction step establishes the polarization directions for the two halves of the transformer. Poling of the input section across the interdigitated electrodes results in a polarization direction that aligns vertically to the thickness. Poling of the output section creates a horizontal or length-oriented polarization direction. Operating the transformer drives the input in thickness mode, which means that an applied voltage between the parallel plates of the input causes the input section to become thicker and thinner on alternate halves of the sine wave. The change in input thickness couples through to the output section, causing it to lengthen and shorten and thereby generating the output voltage. The resulting voltage step-up ratio is proportional to the ratio of the output length and the thickness of the input layers.

Past piezoelectric transformers are based on the well-known Rosen design (U.S. Pat. No. 2,830,274). These high voltage transformer designs are of a piezoelectric ceramic plate which includes a single driving section and a driven section which each have different polarizations. The different polarizations provide for the voltage transformation in these designs. However, these designs have several drawbacks. In particular, the output voltage from the driven section is controlled either by changing the voltage amplitude applied to the driving section or moving the input voltage frequency off the resonant frequency of the transformer. The first method requires a drive regulator, such as a buck regulator, which introduces losses and lowers efficiency. The second method is difficult to control due to the high Q of the transformer and also results in a loss of efficiency. Besides controlling the output voltage by the amplitude and frequency methods mentioned above, duty cycle and phase methods are also available.

Adjustable gain is a common requirement in several applications. For example, in LCD backlights for laptop computers, a constant battery voltage is provided (usually 10 to 20 volts) and the driving transformer is required to have adjustable gain in order to provide adjustable screen brightness.

Prior methods having attempted to provide adjustable again so as to make this parameter independent of the other design parameters. Two of these prior art methods for providing adjustable gain have included frequency modulation and pulse width modulation. Frequency modulation provides adjustable gain as a function of driving the transformer at frequencies that are off resonance. The further off resonance the transformer is driven the less output amplitude is produced and the less gain it has. The off resonance condition has the disadvantage of operating the transformer at less than optimum efficiencies because the piezoelectric transformer is not being driven at a resonance point. Moreover, because the transformer is a high Q device, the resonant frequency peak is very narrow and the slope is very steep making it difficult to control the working point on the slope or keep it on the same side of the slope, and therefore the gain is adversely affected. In addition, the transformer frequency will drift as the operating temperature changes.

A driver circuit in frequency modulation uses an error signal between the desired output and the actual output to change the frequency. The change in frequency required depends on a slope of the gain versus frequency curve. However, this slope varies both in magnitude and polarity which makes a feedback scheme difficult to control. Stability and convergence can only be maintained if the slope polarity is constrained. Moreover, the high Q nature of the transformer and frequency variations with temperature and loading further complicate the operation of such a driver circuit.

Pulse width modulation provides adjustable output voltage as a function of the duty cycle of the driving signal. Changing the duty cycle of the driving signal from a nominal 50% duty cycle lowers the amplitude of the fundamental frequency which reduces the output voltage at that frequency. Pulse width modulation has the disadvantage of diverting power to harmonic frequencies which reduces efficiency and introduces unwanted signals, also.

For example, U.S. Pat. No. 5,747,914 to Huang et al. entitled "DRIVING CIRCUIT FOR MULTISECTIONAL PIEZOELECTRIC TRANSFORMERS USING PULSE-POSITION-MODULATION/PHASE MODULATION" issued on May 5, 1998 and assigned to the assignee of the present invention, discloses a Rosen transformer that is phase driven at opposite ends of the transformer.

SUMMARY OF THE INVENTION

The present invention provides at least two input driving sections for a piezoelectric transformer. The two input driving sections are adjacent, preferably stacked along the thickness dimension of the transformer, with either one section on top of the other or the sections interlaced. Preferably, each section is dimensionally equivalent so that the respective displacements have the desired combinational effect. The two input driving sections provide for the application of phase-modulated input signals to control the gain or amplitude of the transformer output.

One embodiment of the present invention uses four electrode patterns that are grouped into two pairs at one longitudinal (or length) end of the transformer. The first pair is stacked above the second pair. Connections to the electrodes can be provided by connections on the sides of the transformer or by vias. Alternatively, the pairs can be interlaced so that the electrode stack contains alternating pairs of electrodes. A further embodiment provides at least two input driving sections at both ends of the transformer. The output section for this embodiment preferably is disposed between the ends.

Numerous other advantages and features of the present invention will become readily apparent from the following detailed description of the invention and the embodiment thereof, from the claims and from the accompanying drawings in which details of the invention are fully and completely disclosed as a part of this specification.

BRIEF DESCRIPTION OF THE DRAWINGS

In the drawings,

FIG. 3b is a diagram that shows input signals, output signals and displacement that correspond to the series shown in FIG. 3a;

DETAILED DESCRIPTION OF THE PREFERRED EMBODIMENT

Figure 1:
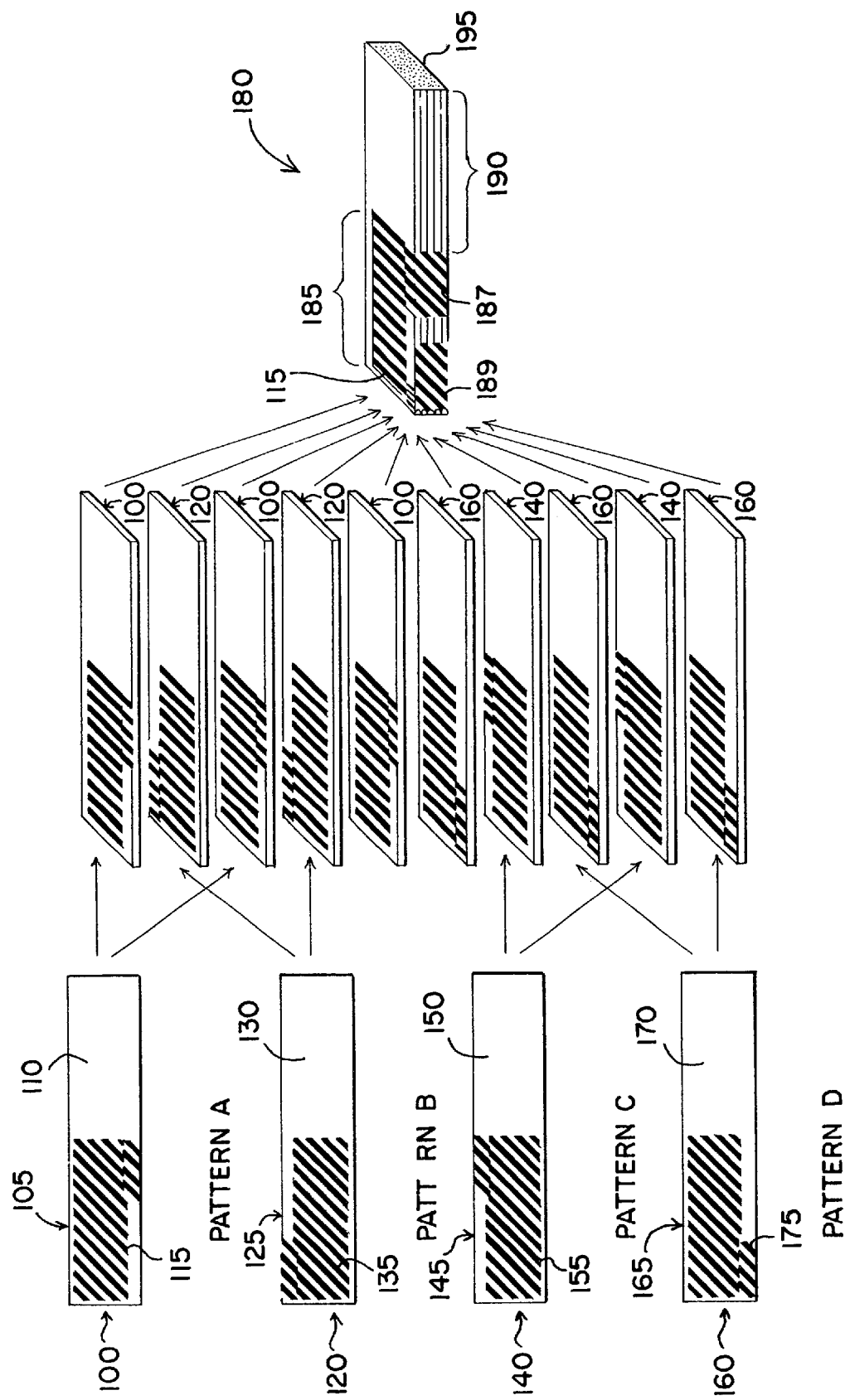
FIG. 1 is an exploded view of one embodiment of a transformer according to the present invention.

While this invention is susceptible to embodiment in many different forms, there is shown in the drawings and will be described herein in detail specific embodiments thereof with the understanding that the present disclosure is to be considered as an exemplification of the principles of the invention and is not to be limited to the specific embodiments described.

The present invention preferably includes a basic Rosen Transformer that is modified to have four input layer electrode patterns instead of two. Referring to FIG. 1, layers 100, 120, 140 and 160 are configured so that when combined in certain combinations, a transformer is ultimately formed. The layers include respective input portions 105, 125, 145, 165 and respective output portions 110, 130, 150, 170. Each of the layers has an electrode with a predetermined shape. Shown in FIG. 1 are electrodes 115, 135, 155 and 175, which each having a different shape and defining the input portions of the layers. The provision of different electrode patterns is a practical consideration of the present invention. Theoretically, electrodes that have the same pattern or, in this case, less than four different patterns can be used and are considered within the scope of the present invention. Output portions 110, 130, 150, 170 preferably are not metallized.

Layers 100, 120, 140 and 150 are preferably formed from a green ceramic tape. Electrodes 115, 135, 155 and 175 are preferably silver or a silver compound. The electrodes 115, 135, 155 and 175 are deposited on the unfired ceramic tape layers in a conventional manner. The ceramic layers are preferably lead-zirconate-lead-titanate (PZT). However, quartz, lithium niobate or any other material that has a piezoelectric characteristic may be used. However, providing the preferred transformer configuration with layering is difficult, but not impossible, with single crystal materials such as quartz and lithium niobate. Therefore, polycrystalline materials are most preferred, such as PZT. Examples of other polycrystalline piezoelectric materials are lead titanate (PT), barium titanate and lead metaniobate (PbNb2O6). Other piezoelectric materials can have a semi-rystalline structure, such as polyvinylidene fluoride (PVDF).

As shown in FIG. 1, the layers are aligned and stacked to form a transformer. First, the layers are stacked in a predetermined order such that the electrode patterns form the preferred two input driving sections. An input driving section is defined by at least one pair of electrodes used in conjunction with the layers. As shown, electrode patterns 115 and 135 are paired together and electrode patterns 155 and 175 are paired together. Each input driving section will preferably have alternating electrode patterns of the associated pair of electrode patterns.

Once stacked, as illustrated in FIG. 1, the ceramic tape layers form a transformer package that is fired and sinter into a single ceramic structure shown as a transformer 180. The transformer 180 includes an input section 185 and an output section 190. Input section 185 includes side connections 187 and 189, and two additional side connections on the opposite side (not shown) of input section 185. Side connections 187 and 189 couple all of electrodes 115 and 175, respectively, in the input section 185. The two additional side connections not shown in the figure connect the electrodes 135 and 155, respectively. Instead of using the side connections, vias can be used. Preferably then, the vias are located in the transformer at points where net strain (displacement) is a minimum. Output section 190 includes an output connection 195 on one end of transformer 180 which preferably is a conductive material. The next construction step establishes the polarization directions for the two halves of the transformer. Poling of the input sections across the interdigitated electrodes results in a polarization direction that aligns vertically to the thickness. Poling of the output section creates a horizontal or length-oriented polarization direction. Operating transformer 180 drives input section 185 in thickness mode, which means that applied voltages between the parallel plates of the input driving sections cause the input driving sections to become thicker and thinner responsive to the dual input signals. The change in input thickness couples through to output section 190, causing it to lengthen and shorten and thereby generating the output voltage at output connection 195. The resulting voltage step-up ratio is proportional to the ratio of the output length and the thickness of the input layers.

Figure 2:
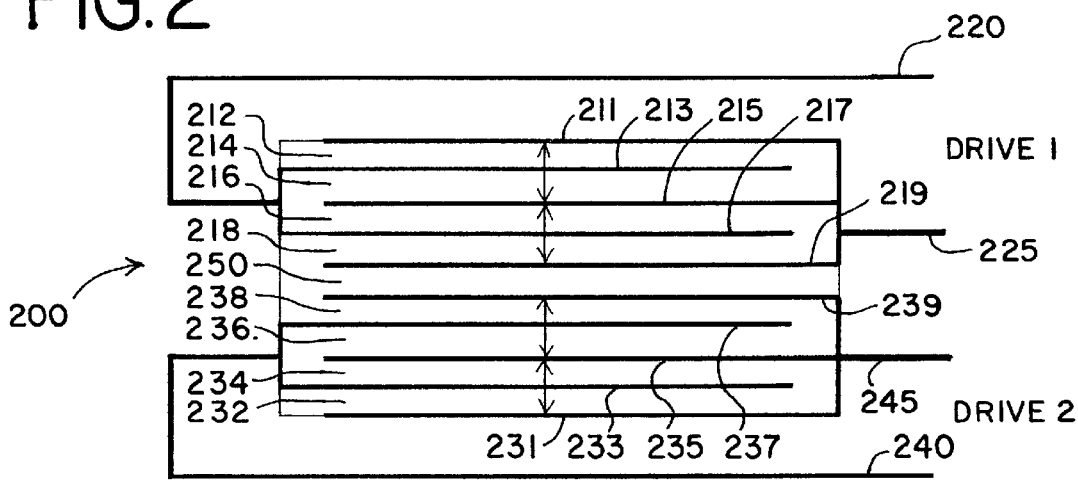
FIG. 2 is a view of the driving section of the FIG. 1 transformer.

Referring to FIG. 2, the input section of a transformer 200 is shown that is constructed in a similar manner as transformer 180 in FIG. 1. A first input driving section includes layers 212, 214, 216 and 218, and electrodes 211, 213, 215, 217 and 219. An input lead 220 is connected to electrodes 213 and 217, and an input lead 225 is connected to electrodes 211, 215 and 219. A second input driving section includes layers 232, 234, 236 and 238, and electrodes 231, 233, 235, 237 and 239. An input lead 240 is connected to electrodes 233 and 237, and an input lead 245 is connected to electrodes 231, 235 and 239. Layer 250 is provided as a separator between the two input driving sections. The arrows in FIG. 2 represent the polarization direction of the individual layers.

Figure 3A:
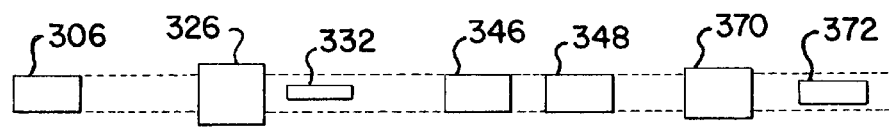
FIG. 3a is a series of side views that show the displacement of the FIG. 1 transformer being driven by dual input signals.

The operation of transformer 200 will be described with reference to FIGS. 3a and 3b. Referring to the NO DRIVE column of FIG. 3b, input signals DRIVE 1 and DRIVE 2 are inactive as shown at 300, 302. As a result, there is no net strain (displacement) as shown by 304. The thickness dimension 306 of the transformer shown in FIG. 3a is static. As expected, there is no output signal OUTPUT as shown by 308. Referring now to the 0° PHASE SHIFT column, input signals DRIVE 1 and DRIVE 2 have a 0° phase shift between themselves as shown by 320, 322. Preferably, both input signals DRIVE 1 and DRIVE 2 are operated at the resonance frequency of the transformer and at a predetermined voltage amplitude. When input signals DRIVE 1 and DRIVE 2 are at their maximum peak 324, the thickness dimension 326 of the transformer as shown in FIG. 3a is also at a maximum. In other words, input signals DRIVE 1 and DRIVE 2 are constructively combined. This results in a maximum net strain 328, which provides the amplitude of output signal OUTPUT having a maximum peak 329. Conversely, when input signals DRIVE 1 and DRIVE 2 are at their minimum peak 330, the thickness dimension 332 of the transformer as shown in FIG. 3a is at a minimum. Input signals DRIVE 1 and DRIVE 2 therefore combine to form a negative peak. The net strain has a negative maximum 334. Hence, the amplitude of output signal OUTPUT has a minimum peak 336.

Figure 3B:
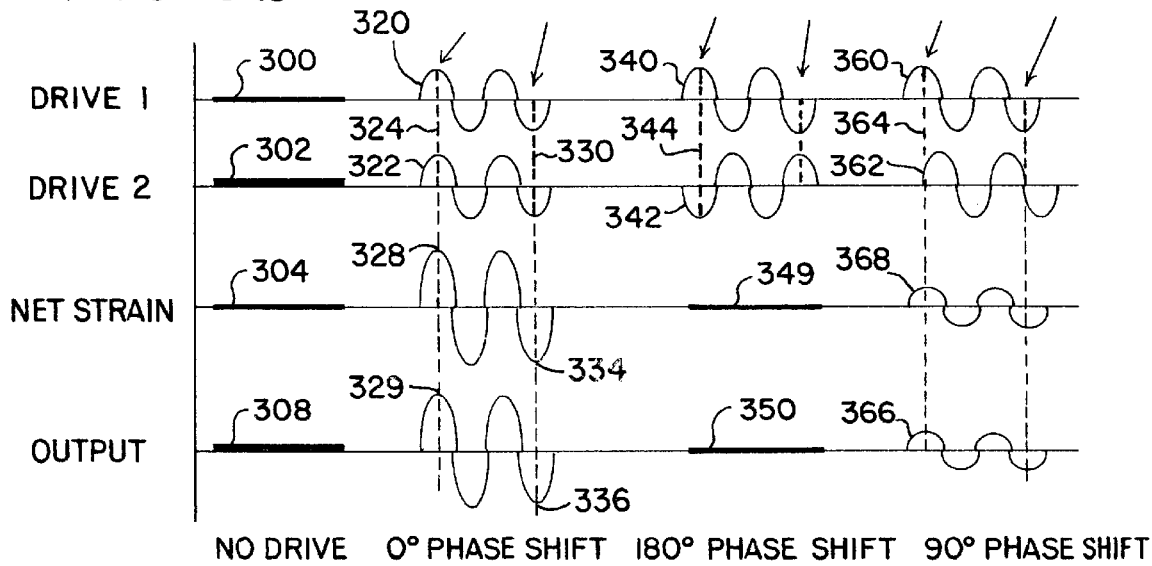

When input signals DRIVE 1 340 and DRIVE 2 342 are 180° out of phase with respect to each other, as shown in the 180° PHASE SHIFT column of FIG. 3b, the dynamic thickness dimension of the first input driving section is inversely related to the dynamic thickness of the second input driving section. As a result, the thickness of the entire transformer in the input section does not substantially change as shown in FIG. 3a by 346, 348. The net strain 349 will be at a minimum. Therefore, according to piezoelectric properties, the amplitude of output signal OUTPUT 350 will be at a minimum. Accordingly, there is no substantial change in thickness, there is no substantial change in length and therefore no corresponding change in the length of the output. This will result in little or no output voltage.

Now turning to the 90° PHASE SHIFT column in FIG. 3b, when input signals DRIVE 1 360 and DRIVE 2 362 are 90° out of phase with respect to each other as shown by 364, the amplitude of the output signal OUTPUT 366 is between the amplitudes of the previous columns. This means that the net strain 368 is between a minimum and a maximum. The cancellation effect seen at 180° still occurs but the resulting peak dimensional change is now half of the 0° phase drive. This correspondingly results in half the length change and have the dimensional change in the output section as indicated by 368, 370 and 372. Thus, as can be gleaned from FIGS. 3a and 3b, the amplitude of the output signal OUTPUT can be continuously controlled by varying the phase difference between input signals DRIVE 1 and DRIVE 2.

Figure 4:
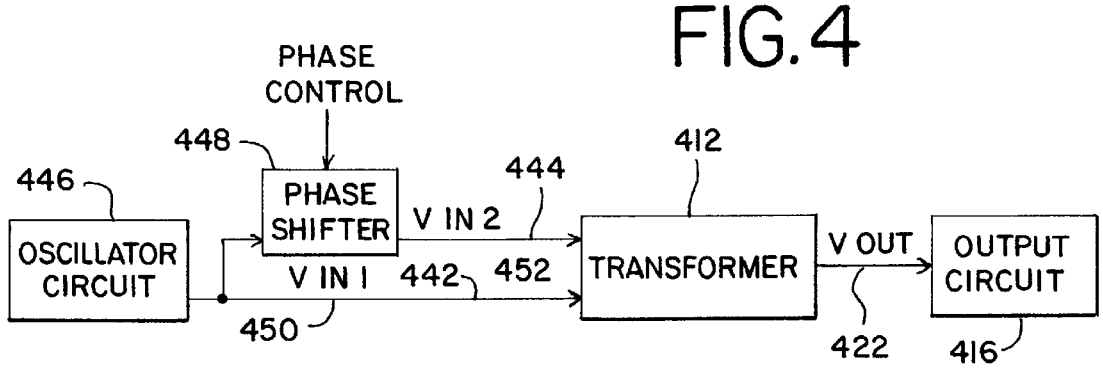
FIG. 4 is a block diagram of a input signal provider used in conjunction with a transformer according to the present invention.

The transformer of the present invention can be used in conjunction with any circuit that provides phase variability for input signals DRIVE 1 and DRIVE 2. One such a circuit is shown in FIG. 8 of U.S. Pat. No. 5,747,914 (the '914 patent) to Huang et al. entitled "DRIVING CIRCUIT FOR MULTISECTIONAL PIEZOELECTRIC TRANSFORMERS USING PULSE-POSITION-MODULATION/PHASE MODULATION" issued on May 5, 1998 and assigned to that assignee of the present invention, which is hereby incorporated by reference. For purposes of completeness, FIG. 8 of the '914 patent is shown in FIG. 4. FIG. 4 is a block diagram of an embodiment of a transformer circuit using phase-modulated sine waveforms for driving the inputs of the transformer of FIG. 2. In this embodiment, an oscillator circuit 446 and a phase shifter 448 are coupled to transformer 412. A first input 442 of the transformer 412 is driven by a sinewave 450, Vin1, produced by the oscillator circuit 446 at a resonant frequency of the transformer 412. It should be recognized that there are many oscillator circuits known in the art and any of them can be successfully implemented in the present invention. The sinewave 450, Vin1, is also applied to a variable phase shifter 448 controlled by an external phase control. The phase shifter 448 provides a second sinewave 452, Vin2, which is substantially identical to Vin1 but having a relative phase shift responsive to the phase control. This second sinewave 452, Vin1, is applied to a second input 444 of the transformer 412. The phase shifted signal, Vin2, can be adjusted continuously between 0° and 180° relative to the oscillator signal, Vin1, which provides control of the transformer output 412 in the previously described manner.

Figure 5:
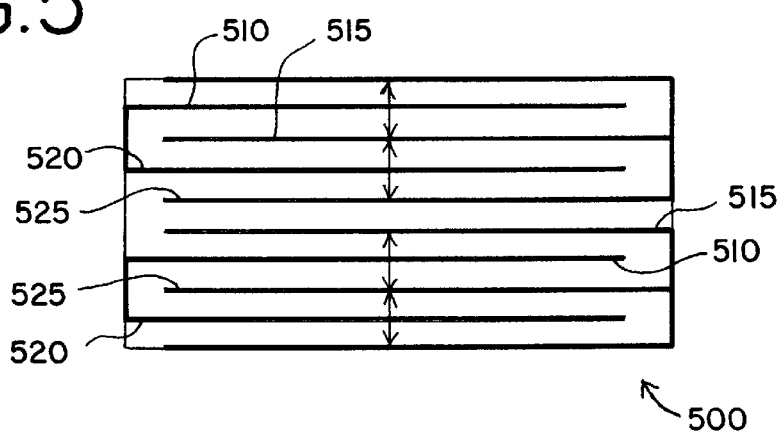
FIG. 5 is a side view of another embodiment of the driving section of the present invention.

In an alternative embodiment, a first input 442 of the transformer 412 self-oscillates with the oscillator circuit 446 at a resonant frequency of the transformer 412. It should be recognized that there are many crystal oscillator circuits known in the art, such as a Colpitts design, which can be successfully implemented in the present invention to self-oscillate with the first input 442. The advantage of providing self-oscillation is that the oscillator circuit 446 is self-tuning to track the resonant frequency of the piezoelectric transformer. Advantageously, this results in a simpler and lower cost circuit topology. Another circuit for providing phase-modulated input signals is shown in FIG. 5 of the '419 patent, which is incorporated herein by reference. The FIG. 5 circuit can be used as shown in the '419 patent, or can be used in conjunction with circuitry that will provide sinusoidal signals from the pulse signals.

Another embodiment of the present invention is shown in FIG. 5. Shown is an end of an input section 500 that includes four electrode patterns. The electrode patterns are configured in pairs and, instead of forming two discrete input driving sections as shown in FIGS. 1 and 2, the pairs are interlaced so that a second pair is disposed between two first pairs. To illustrate, an electrode pair 520, 525 is disposed between electrode pairs 510, 515. Also, an electrode pair 510, 515 is disposed between electrode pairs 520, 525. Each electrode 510, 515 and 520, 525 are connected to a respective leads (not shown). In addition, the sections can be intermixed, such as the interlacing, without being interlaced in an alternating fashion. Preferably, though, the aggregate dimensions of the sections should be substantially the same to provide displacements as discussed in FIGS. 3*a* and 3*b*.

Figure 6:
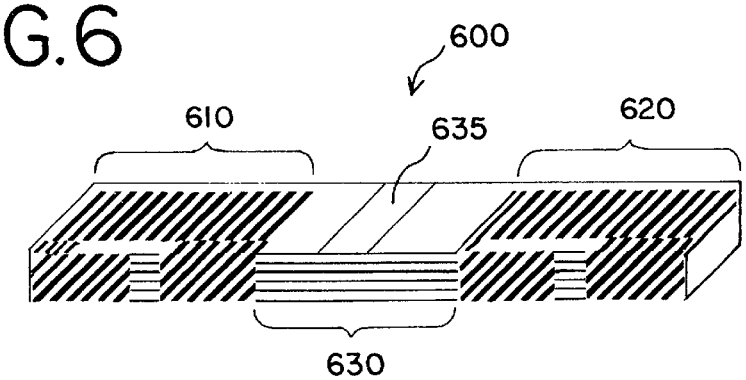
FIG. 6 is a perspective view of another embodiment of a transformer according to the present invention.

A further embodiment is shown in FIG. 6. A transformer 600 is shown that has first input section 610, second input section 620 and an output section 630. Input sections 610 and 620 can separately have the structure shown in FIG. 2 or FIG. 5. The transformer 600 should be processed so that output section 630 is mechanically coupled to input sections 610 and 620 to provide an output signal. To that end, an output electrode 635 should be disposed on output section 630 to provide an output signal.

In addition, the present invention can be used with transformers that have a lambda, a 1/2 lambda or a 3/2 lambda characteristic. The above transformer 600 is the 3/2 lambda configuration. Also, if desired, two different piezoelectric materials can be used for the input driving sections. Thus, one input driving section may have less layers than the other. By preference, the aggregate displacement of the first material should be substantially similar to the second material.

Numerous variations and modifications of the embodiment described above may be effected without departing from the spirit and scope of the novel features of the invention. It is to be understood that no limitations with respect to the specific device illustrated herein are intended or should be inferred. It is, of course, intended to cover by the appended claims all such modifications as fall within the scope of the claims.

What is claimed is:

1. A gain-adjustable piezoelectric transformer comprising:
   a multilayer body of piezoelectric material having an input section and an output section, the input section including
   a pair of independently-drivable subsections,
   each independently-drivable subsection having a plurality of piezoelectric layers, a first connected set of interlayer electrodes and a second connected set of interlayer electrodes, the electrodes of the first set being interlaced with the electrodes of the second set; and
   an input circuit providing a first driving signal and a second driving signal having an externally adjustable phase relationship therebetween,
   the first of the pair of subsections being configured to receive the first driving signal into the first set and second set of electrodes;
   the second of the pair of subsections being configured to receive the second driving signal into the first set and second set of electrodes,
   whereby an adjustment in the phase relationship between the driving signals causes an adjustment in transformer gain.

2. The transformer according to claim 1 wherein the pair of independently drivable subsections are positioned in a stacked relationship.

3. The transformer according to claim 2 wherein the input section includes a separator layer between the pair of independently drivable subsections.

4. The transformer according to claim 1 wherein the piezoelectric material is a polycrystalline piezoelectric material.

5. The transformer according to claim 1 wherein the piezoelectric material is a lead-zirconate-lead-titanate (PZT).

6. The transformer according to claim 1 wherein the input circuit is an oscillating circuit providing phase modulated driving signals to the subsections of the piezoelectric transformer using substantially sine-wave driving signals.

7. The transformer according to claim 1 wherein one set of connected electrodes from each of the pair of subsections is connected to a common ground potential.

8. The transformer according to claim 1 wherein the input circuit includes an oscillation subcircuit configured to track the frequency of one of the input driving signals to a resonant frequency of one of the pair of independently drivable subsections.

9. The transformer according to claim 1 wherein the piezoelectric body is elongate and substantially rectangular.

\* \* \* \* \*